US005982475A

United States Patent [19]

Bruning

[11] Patent Number: 5,982,475

[45] Date of Patent: Nov. 9, 1999

[54] RASTER-SCAN PHOTOLITHOGRAPHIC REDUCTION SYSTEM

[75] Inventor: John H. Bruning, Pittsford, N.Y.

[73] Assignee: Tropel Corporation, Fairport, N.Y.

[21] Appl. No.: 08/941,120

[22] Filed: Sep. 30, 1997

[51] Int. Cl.[6] ............................ G03B 27/42; G03B 27/72

[52] U.S. Cl. .................................. 355/53; 355/67; 355/71

[58] Field of Search .................................. 355/53, 67, 71, 355/50, 77

[56] References Cited

U.S. PATENT DOCUMENTS 3,762,821 10/1973 Bruning et al. .
4,701,608 10/1987 Morita et al. .
4,703,166 10/1987 Bruning .
4,748,477 5/1988 Isohata et al. .
4,749,867 6/1988 Matsushita et al. .
4,773,750 9/1988 Bruning .
4,825,086 4/1989 Mueller .
4,883,352 11/1989 Bruning .
4,924,257 5/1990 Jain .
5,281,996 1/1994 Bruning et al. .
5,285,236 2/1994 Jain .
5,291,240 3/1994 Jain .
5,473,408 12/1995 Hoffman et al. .
5,473,410 12/1995 Nishi .
5,579,147 11/1996 Mori et al. .
5,650,877 7/1997 Phillips, Jr. et al. .
5,710,619 1/1998 Jain et al. ................................. 355/53

OTHER PUBLICATIONS

"Evaluation of Effect of Scanning on the resolution of Optical Systems" by G.N. Buinov & N. Yu. Kontievskaya Sov. J. Opt. Technol. 48(9), Sep. 1981, pp. 566–567.

"Optical Fabrication Rises to the 193–nm Challenge" by James Webb and John Nemechek, Laser Focus'World, Feb. 1997, pp. 75–82.

"Optical Lithography—Thirty Years and Three orders of Magnitude" by John Bruning, Reprinted from Emerging Lithographic Technologies, vol. 3048, Mar. 10–11, 1997–Society of Photo–Optical Instrumentation Engineers, pp. 14–27.

*Primary Examiner*—Alan A. Mathews
*Attorney, Agent, or Firm*—Eugene Stephens & Associates

[57] ABSTRACT

A reduction photolithographic scanning system uses a reduction lens with a circular image field that is shaped to an irregular hexagonal configuration affording different effective scanning widths so that the full area of a microcircuit image can be scanned onto a substrate in an integer number of overlapping scans. This minimizes the number of scans required for each image area and maximizes the total image area that can be scanned per time unit.

37 Claims, 3 Drawing Sheets

SOURCE 11
10
13 13
12
ILLUMINATOR
RETICLE 14
REDUCTION LENS 15
SUBSTRATE 16

26 30
14
28 35 31 36
29
35 32 37
35 33
27

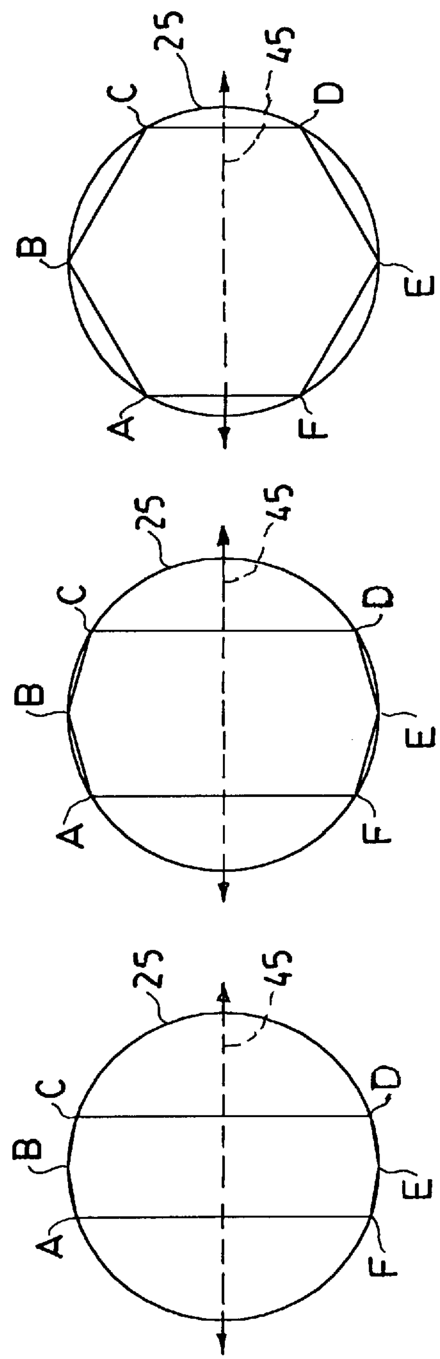
25
45
A
B
C
D
E
F
FIG. 3
FIG. 4
FIG. 5
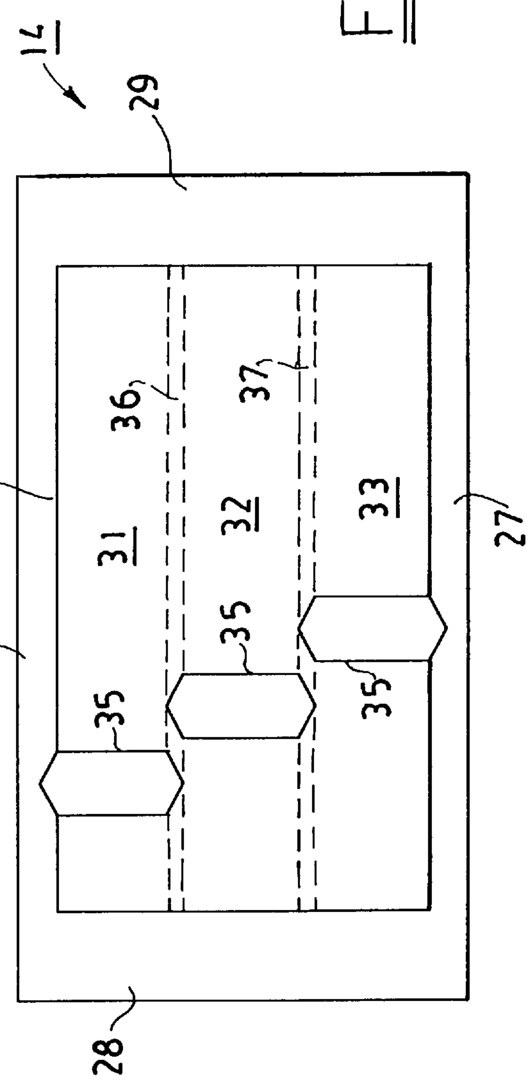
14
26
27
28
29
30
31
32
33
35
36
37
FIG. 6

RASTER-SCAN PHOTOLITHOGRAPHIC REDUCTION SYSTEM

TECHNICAL FIELD

A reduction system of photolithography using a reticle bearing an image of a microcircuit pattern for raster scanning a reduced size image of the microcircuit pattern on a substrate.

BACKGROUND

The evolution of efforts to achieve finer dimensions for elements of microcircuit devices while also making such devices larger has led to a variety of expedients involving both step and repeat and scanning processes. U.S. Pat. No. 5,281,996, for example, suggests exposure on a substrate of juxtaposed images of microcircuit patterns so that a lens having an image field smaller than the total pattern to be imaged can complete the imaging in two or more steps. This patent also suggests scanning an image with a long and narrow bar of actinic radiation spanning the image field.

U.S. Pat. No. 4,924,257 suggests raster scanning a full substrate with image patterns exposed within the shape of a regular hexagon sweeping repeatedly across the substrate in an overlapping pattern that exposes the substrate uniformly. Either a large pattern filling the whole substrate or a series of smaller patterns fitting within the hexagonal shape can be scanned this way. U.S. Pat. Nos. 5,285,236 and 5,291,240 offer similar suggestions.

SUMMARY OF THE INVENTION

This invention advances raster scanning in photolithographic reduction systems by devising a way that image patterns too large for the image field of a reduction lens can be scanned in an integer number of sweeps of a variably shaped area of actinic radiation across an image area on a substrate. The variable shape is accomplished by variably illuminating an image field of a reduction lens to achieve scanning shapes differing in both full exposure scan width and scan overlap dimensions so that an integer number of substantially equal scanning sweeps across a reticle pattern uniformly exposes the full reticle pattern on a substrate. Configuring an illuminating system or mask to accomplish full image scanning in an integer number of scans optimizes the efficiency of the scanning process to maximize the output rate for scanning images onto substrates. When the substrate is a wafer, for example, which can be 300 millimeters or more in diameter, and the image patterns to be scanned onto the substrate are rectangles having heights and widths that both exceed the diameter of the image field of the reduction lens, a scanning shape can be selected so that each image pattern can be scanned in an integer number of substantially equal scans to take full advantage of the lens image field potential and complete the scanning of all the required image patterns onto the wafer in a minimum amount of time.

A preferred shape for a variably illuminated image field for scanning purposes is a hexagon with different length sides subtending different angles. Each of the hexagon sides is preferably disposed as a cord of the circular image field of the reduction lens so that corners of the hexagon intersect the circular image field. A pair of parallel and equal length sides of the hexagon are preferably disposed perpendicular to a scan direction so that a rectangular area between such sides constitutes a full-exposure scanning region. The remaining regions of the hexagon are a pair of triangles having bases parallel with the scan direction and extending between ends of the parallel sides. The heights of these triangles are preferably equal; and their apexes preferably intersect the circular image field, which makes the triangles congruent and isosceles. The regions within these triangles are overlapped between successive scans so that double exposures from the triangular regions also produce a full exposure. By adjusting the length of the sides perpendicular to the scanning direction and the corresponding height of the triangles above and below these sides, a full image pattern can be scanned onto the substrate in an integer number of scans of varying widths. This optimizes the image capacity of the reduction lens and completes the scanning in the minimum time required by other scanning parameters, such as a pulse rate of a source of actinic radiation, and a necessary exposure time of a photosensitive material on the substrate.

DRAWINGS

FIG. 1 schematically illustrates a preferred embodiment of my raster scanning photolithographic reduction system.

FIG. 2 schematically shows an element of a catadioptric reduction lens that my system preferably employs.

FIGS. 3–5 schematically show three of a multitude of possible variations in preferred hexagonal masking of a circular image field for scanning purposes.

FIG. 6 schematically shows a scanning pattern of three sweeps of a preferred scanning shape across a full image of a reticle for reduction lithography purposes.

FIG. 7 schematically shows the reticle pattern of FIG. 6 reduced to an image on a substrate in three successive scans.

DETAILED DESCRIPTION

Figure 1:
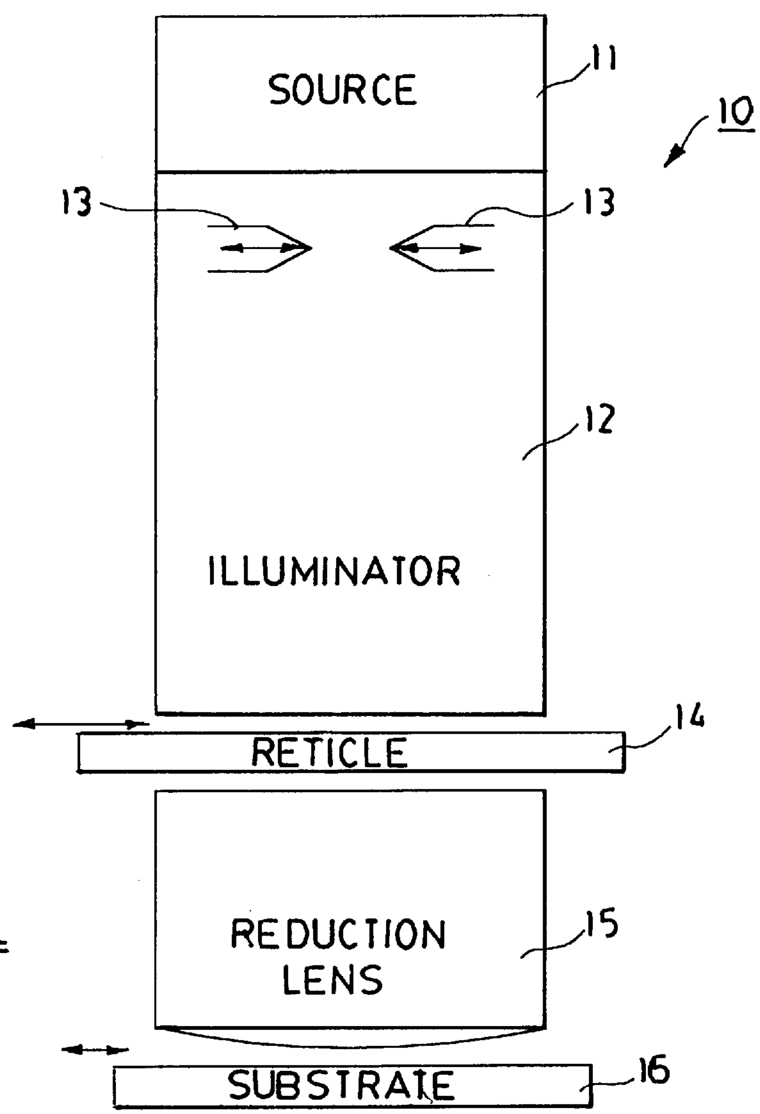

System 10 of FIG. 1 illustrates a preferred arrangement of components for practicing my invention, including a source 11 of an actinic radiation that is preferably deep UV such as attainable from an excimer laser producing light at a wavelength of about 193 or 157 nanometers. Other deep UV or soft X-ray sources may also prove workable.

Light from source 11 is transmitted to reduction lens 15 by illuminator 12, which is designed in generally known ways for directing uniformly intense radiation to the full area of a viewing field of lens 15. A reticle 14 having a microcircuit image pattern is arranged at the object field plane of lens 15, and a substrate 16 to be exposed to the reduced image from reticle 14 is arranged at an image field plane of lens 15.

Illuminator 12 includes a variable system for illuminating the image field, preferably by concentrating the available illumination in a hexagonal region within the image field. This can be done in several ways and, for purposes of illustration, is accomplished by a mask 13 arranged within illuminator 12. Mask 13 is preferably formed of movable mechanical elements, as schematically illustrated, for masking out variable peripheral portions of the image field of lens 15. Illuminator 12 preferably images mask 13 at the viewing field plane of reticle 14 so that light outside of variable length cords of a circular viewing and imaging field of lens 15 is excluded during scanning. The preferred configurations and operations of the variable masking and illuminating are explained more fully relative to FIGS. 3–7.

The invention can be practiced with a variety of lenses, including conventional, high numerical aperture, refractive lenses. A preferred form of a refractive lens is a monochromatic lens formed of a single material, such as fused silica or calcium fluoride, combined with a narrow bandwidth light source. Such a lens and light source has the advantage of not requiring correction for chromatic aberration, and examples of this type of lens are given in U.S. Pat. Nos. 4,883,352 and 4,773,750.

Figure 2:
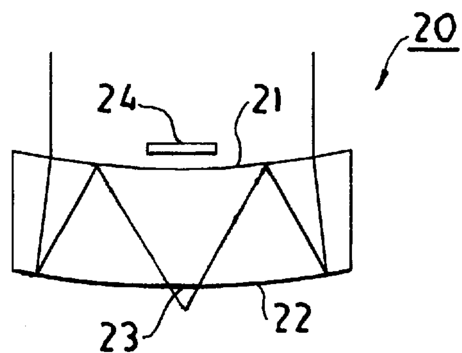

One lens that is preferred for use with the invention to achieve image pattern resolution finer than 0.2 microns, and approaching 0.07 microns, is catadioptric lens 15, which preferably uses a reduction element 20 as schematically illustrated in FIG. 2. The operation of element 20 in the reduction lens 15 is explained in detail in commonly assigned U.S. patent application Ser. No. 08/514,614, to issue Jul. 22, 1997, as Pat. No. 5,650,877, which is hereby incorporated by reference. Basically, lens 15 minimizes refractive elements (not shown in FIG. 2) and gets most of its optical power for image reduction from reflecting element 20, which has an external, half-reflecting concave surface 21 and an internal, concave fully reflecting surface 22 with a central aperture 23. An opaque element 24 blocks any passage of light straight through element 20 and aperture 23 so that all light passing through aperture 23 follows only the intended optical paths. Half of the light incident on surface 21 is refracted to mirror 22, which reflects incident light back to surface 21. Half of this return reflected light is then reflected through aperture 23 as illustrated.

Minimizing refraction and relying on reflective reduction accomplished by element 20 help make it possible to achromatize lens 15 over the operating spectrum of an excimer laser or other source 11. This allows lens 15 to achieve a fine resolution while conserving on expensive materials and numbers of elements. Lens 15, primarily by exploiting reduction element 20, also achieves a relatively large numerical aperture, which additionally aids in fine resolution. Laboratory versions of lens 15 having an image field of about 2 millimeters are now in use, and lens 15 can be scaled up to enlarge the image field into the range of 8 to 15 millimeters. Lens 15, with proper selection of materials, can be tuned for operation with light sources having wavelengths as small as 157 nanometers, such as from a fluorine excimer laser, allowing resolutions of 0.07 microns and less. The preferred material for reduction element 20 of lens 15 varies with the wavelength of light being transmitted: for a 193 nanometer wavelength, the material is preferably fused silica; and for a 157 nanometer wavelength, the preferred material is calcium fluoride.

In raster scanning with system 10, reticle 14 and substrate 16 are moved simultaneously at rates of speed that correspond to the reduction achieved by lens 15. Assuming, for example, a 4-to-1 reduction by lens 15, reticle 14 is moved four times as fast and four times as far as the corresponding movement of substrate 16. These movements, of course, are made uniform and smooth and are carefully controlled by sophisticated servos with interferometric metrology so that each scanning sweep of a region of substrate 16 is accurately positioned and produces a uniform exposure aimed at error-free imaging of each microcircuit pattern.

Substrate 16 can be a wafer to be imaged with a repeated number of image patterns, as is typical in producing microcircuit chips. Substrate 16 can also take other forms, such as a reticle to be used for patterning of microcircuit devices. A reticle scanned as I propose can later be deployed for contact or proximity printing or for projection imaging, possibly with further image reduction.

Preferred variations in masked scanning shapes for use in my invention are schematically shown in FIGS. 3–5. These represent three of an infinite multitude of possible shapes of irregular hexagons that can be selected for scanning any size image pattern in an integer number of scans. In each of these illustrations, the circle 25 represents the full imaging field of reduction lens 15, and the irregular hexagons shown within circles 25 represent variations in scanning shapes for scanning each image pattern in an integer number of scans. The irregular hexagons have corners labeled A through F that intersect circles 25 so that the varying length sides of the hexagons between corners A through F are disposed as cords of circles 25.

A scanning direction for the hexagons is indicated by broken line, double-headed arrows 45, which orient hexagon sides A-F and C-D perpendicular to the scanning direction. The differences in the shapes illustrated in FIGS. 3–5 show the variations in scanning width obtainable from varying the height of the possible hexagonal shapes within circles 25. The tall and narrow hexagon of FIG. 3 achieves a wide scan, the shorter and wider hexagon of FIG. 4 achieves a narrow scan, and the much shorter and wider hexagon of FIG. 5 achieves a much narrower scan width. An extreme example occurs when the sides A-F and C-D collapse and the hexagon becomes an equi-sided diamond.

When the hexagons of FIGS. 3–5 are scanned in the horizontal direction illustrated by the broken line arrows 45, a full-exposure scanning width occurs in the rectangular area bounded within lines extending between A-C-D-F; and the width of this full-exposure scanning zone is equal to the length of A-F and C-D, which establish a full exposure height for the hexagon.

Triangular regions at the top and bottom of each hexagon have bases parallel with the scanning direction and extending between the ends of parallel sides A-F and C-D. These triangular regions are preferably isosceles triangles having bases A-C and D-F and apexes at B and E. The regions scanned by these triangles are overlapped on successive scans to produce double exposures formed first by triangles D-E-F and second by triangles A-B-C, for scans proceeding successively downward across the area of a microcircuit pattern, as illustrated in FIG. 6. The two overlapped exposures of the triangular regions equal a single full exposure so that overlaps between full-exposure scans become uniformly and fully exposed to the same exposure level as scan regions that are not overlapped. In this sense, the triangular regions can be referred to as partial-exposure or half-exposure regions.

Illuminator 12 is preferably designed to direct illumination into unmasked regions of viewing and imaging field 25 so that when a tall and narrow hexagon, such as shown in FIG. 3, is selected for an integer number of scans, light that would otherwise be masked out and wasted is concentrated within the hexagonal area A-F. A preferred way to accomplish this is to use anamorphic prisms arranged and oriented for expanding and compressing light in both horizontal and vertical directions. This allows a square illuminated area to be transformed into a rectangular area in which the aspect ratio of the rectangle can be made greater or less than unity. Such an anamorphic concentrator/expander allows the shape of the illuminated area to change without energy loss.

An expeditious strategy then becomes selection of a hexagon that is as tall as possible in the vertical A-F and C-D direction so that with the necessary scan overlaps, a complete microcircuit pattern can be scanned in an integer number of scans. This strategy has several advantages. It reduces waste of triangular illumination expended along opaque upper and lower borders 26 and 27 around a microcircuit pattern 30 of reticle 14, as shown in FIG. 6. It also reduces the over-scanning distance required at opaque ends 28 and 29 of reticle 14 before moving the scanning light vertically from one scanning path to another. In FIG. 6, this is illustrated by a first scanning path 31 requiring that the scanning hexagon 35 have a triangular overlap with upper border 26, a second scanning path 32 having an overlap with scanning path 31 in overlap region 36, and a third scanning path 33 overlapping with scanning path 32 in overlap region 37 and having a triangular overlap with opaque bottom border 27. The scanning hexagon 35 travels between paths 31–33 at opaque ends 28 and 29, and the narrow width of scanning hexagons 35 in the scan direction minimizes the travel and time necessary do so this.

Selection of an optimum scanning shape for the size of a substrate area to be imaged requires several considerations. An integer number of substantially equal scans is important for efficiency, as is using most of the radiation available for scanning purposes. As the width of a full-exposure scan region is reduced by shortening the height of sides A-F and C-D, the width of the triangular overlap zones 36 and 37 increases. This requires more of an image area to be double-exposed, rather than single-exposed, which tends to reduce efficiency. The width of overlaps 36 and 37 is equal to the base-to-apex height of triangles A-B-C and D-E-F. Since these triangles are confined within circular image fields 25, their height, and the width of the corresponding overlaps 36 and 37, varies inversely with the height of sides A-F and C-D.

As the height of the full-exposure regions within A-F and C-D increases and the corresponding horizontal dimension in the A-C and F-D direction diminishes, the turnaround distance and thus the turnaround time are reduced. This turnaround or overhead time can continue to decrease until it becomes limited by the maximum acceleration of the scanning stages.

Figure 7:
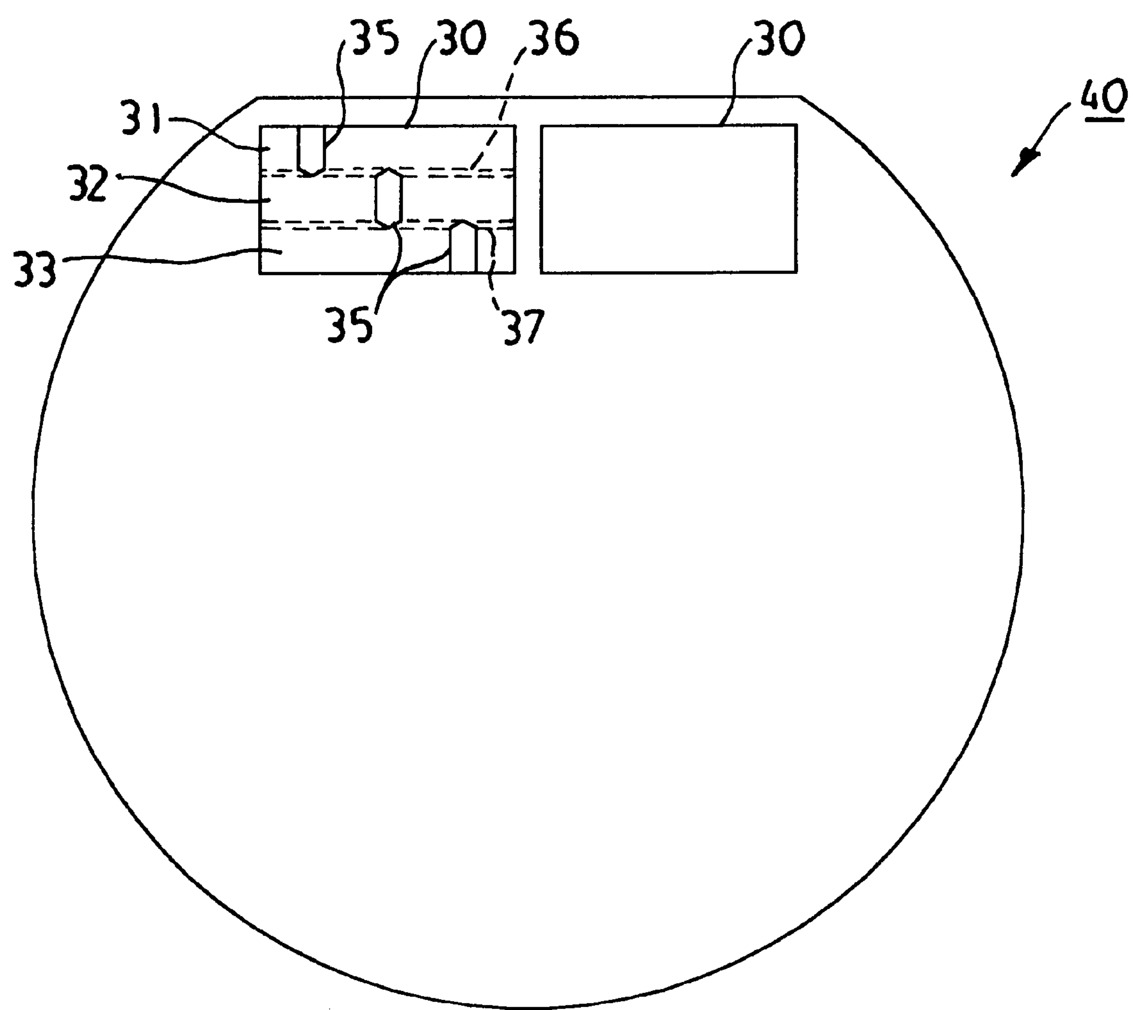

In the illustration of FIG. 7, a wafer 40 is chosen to represent substrate 16, onto which is imaged the reduced pattern 30 of reticle 14. Other substrates, for other purposes, such as forming reticles having microcircuit patterns can also be used with my invention.

The microcircuit pattern 30 is imaged in reduced form on wafer 40 by the same three scanning paths 31–33 that are also illustrated in FIG. 6. Triangular overlaps of scanning shapes with opaque reticle borders 26 and 27 are blocked out of the image that appears on wafer 40, as are the necessary marginal turnarounds between paths 31–33. The overlaps 36 and 37 between the scanning paths are illustrated, however. The result images the full pattern 30 on the illustrated regions of the wafer 40 in the three successive scans. This raster scanning method can be repeated, image area by image area, for as many scans as are required for each image area, until as many complete images as possible are scanned onto wafer 40. Except for overlaps at top and bottom borders 26 and 27 of reticle 14, each scan area is preferably equal and identical and selected to make optimum use of the available image area of lens 15 to complete each image area in an integer number of scans. The number of these can vary, of course; and it is also possible to adjust the movements of reticle 14 and substrate 16 to scan in several integer sweeps across a row of image areas.

The speeds used for scanning rates are affected by several considerations. The preferred excimer laser for deep UV radiation is pulsed, preferably at a rate ranging upward from 500 pulses per second to 1000 or more pulses per second. Each point on a substrate to be imaged is preferably exposed to a minimum number of pulses of radiation (40 to 50 pulses, for example) while it is swept by a scanning illuminated shape. It is desirable to have many pulses contributing to the exposure at all points so that the non-uniformity of exposure resulting from pulse-to-pulse variations in energy is minimized. The speed of scanning is also affected by acceleration and deceleration that is required during movements laterally between scans.

When optimum choices are made according to my invention, raster scanning can image large chips or reticles with fine resolution and an efficient throughput rate. The preferred catadioptric lens using a reflective reduction element can achieve fine resolution and can be scaled up to image large microcircuit pattern areas in a reasonable number of scans. By appropriately varying hexagonal scanning shapes, each substrate area can be scanned in an integer number of essentially equal scanning sweeps that optimize the capability of the scanning lens and improve throughput.

I claim:

1. A reduction photolithography system using a reduction lens forming a circular image field in a plane of a substrate to be imaged and an illumination system for shaping the image field to a hexagonal configuration for raster scanning, the system comprising:

a. the illumination system being variable for providing the hexagonal configuration with different length sides subtending different angles and disposed as cords of the circular field;

b. a pair of parallel and equal length sides of the hexagonal configuration being disposed perpendicular to a scan direction and having variable lengths that establish a width of a full-exposure region of a scan; and c. a pair of congruent isosceles triangles having bases parallel with the scan direction and extending between ends of the parallel sides, and the triangles providing half-exposure regions for overlap of successive scans.

2. The system of claim 1 wherein the variable length of the parallel sides of the hexagonal configuration perpendicular to the scan direction are selected so that a full area of a pattern for a microcircuit device is scanned onto a substrate in an integer number of substantially equal scans.

3. The system of claim 1 wherein the reduction lens is a catadioptric achromatized lens.

4. The system of claim 1 wherein the overlap of successive scans equals a base-to-apex height of the triangles and varies with the length of the sides perpendicular to the scan direction.

5. The system of claim 1 wherein the triangles have apexes intersecting the circular field.

6. The system of claim 1 wherein the reduction lens is a monochromatic refractive lens formed substantially of a single material, and the illuminating system uses a narrow bandwidth of illumination.

7. A reduction photolithographic system using a reduction lens forming a circular image field at a plane of a substrate to be imaged from a reticle, and an illuminating system for shaping the image field to a hexagonal configuration for raster scanning a microcircuit pattern of the reticle onto the substrate, the system comprising:

a. the hexagonal configuration of the image field being variably irregular so that sides of the hexagonal configuration having different lengths are arranged as cords of the circular image field which is smaller than a region of the substrate exposed to an image of the microcircuit pattern; and b. two parallel and opposite sides of the hexagonal configuration being variable in height and disposed perpendicular to a scan direction, the variable height of the opposite sides being selected so that the hexagonal configuration can scan a full image of the microcircuit pattern uniformly onto the region of the substrate in an integer number of substantially equal scans.

8. The system of claim 7 wherein the microcircuit pattern scanned onto the substrate serves as a reticle for forming a microcircuit device conforming to the pattern.

9. The system of claim 7 wherein the scanned region of the substrate forms a layer of a microcircuit device.

10. The system of claim 7 wherein the reduction lens is a catadioptric lens achromatized over a range of a deep UV source of actinic radiation.

11. The system of claim 10 wherein the lens has a reduction element with a concave, half-reflecting external surface and a concave, fully reflecting internal surface with a central aperture upstream of the image field.

12. The system of claim 7 wherein overlap between successive scans of the hexagonal configuration varies with the height of the opposite sides.

13. The system of claim 12 wherein the overlap is imaged by variable triangular regions of successive scans.

14. The system of claim 7 wherein the reduction lens is a monochromatic refractive lens formed substantially of a single material, and the illuminating system uses a narrow bandwidth of illumination.

15. In a raster-scan system for reduction photolithography using a catadioptric reduction lens having a circular image field at a plane of a substrate to be imaged from a reticle pattern for a microcircuit device and an illumination system for shaping the image field to a configuration that allows raster scanning, the improvement comprising:

a. the image field being formed as an irregular polygon having sides disposed as cords of the circular image field, the sides having variable lengths selected so that an integer number of scans of a viewing field of the lens across the reticle pattern images the reticle pattern uniformly on the substrate with each of the scans being substantially equal; and b. the reduction lens being achromatized over a range of a deep UV source of actinic radiation and having a reduction element with a concave half-reflecting external surface and a concave fully reflecting internal surface with a central aperture upstream of the image field.

16. The improvement of claim 15 wherein the irregular polygon is a hexagon.

17. The improvement of claim 16 wherein an opposed pair of parallel and variable length sides of the hexagon are disposed perpendicular to a scan direction.

18. The improvement of claim 15 wherein the substrate imaged with the reticle pattern is a layer of a microcircuit device.

19. The improvement of claim 15 wherein the irregular polygon has a pair of parallel opposite sides disposed perpendicular to a scan direction to establish a full-exposure scan width, and regions of the polygon alongside the full-exposure region provide reduced exposure for overlap of successive scans.

20. The improvement of claim 19 wherein the reduced exposure regions are triangular.

21. A reduction photolithographic raster-scanning method comprising:

a. variably illuminating a circular image field of a reduction lens to form the image field as an irregular hexagon having variable length sides disposed as cords of the circular image field; and b. dimensioning the sides of the hexagon to form successive scans of full-exposure regions of the hexagon and overlapped half-exposure regions of the hexagon that uniformly expose a full area of a microcircuit pattern onto a region of a substrate in an integer number of substantially equal scans.

22. The method of claim 21 including using a catadioptric reduction lens that is achromatized over the wavelength range of a light source for the scans.

23. The method of claim 22 including using within the reduction lens a reducing element having a concave, half-reflecting external surface and a concave, fully reflecting internal surface with a central aperture upstream of the image field.

24. The method of claim 21 including varying the overlapped width of the half-exposure regions inversely with a width of the full-exposure regions.

25. The method of claim 21 including using a monochromatic refractive reduction lens and a narrow bandwidth light source for the scans.

26. A method of raster scanning a reduced image of a microcircuit reticle pattern onto a substrate for photolithographic purposes, the method using a catadioptric reduction lens having a circular image field at a plane of the substrate, and the method comprising:

a. confining illumination of the circular image field to a region within cords forming an irregular hexagon having corners intersecting the circular image field; and b. varying the length of parallel cords of the hexagon disposed perpendicular to a scanning direction so that exposure of the substrate from overlapped scans of the hexagon uniformly images the full area of the microcircuit pattern onto the substrate in an integer number of substantially equal scans.

27. The method of claim 26 including directing each of the integer number of scans to traverse a portion of the microcircuit pattern and a region of the substrate exposed to an image of the microcircuit pattern.

28. The method of claim 26 including using within the reduction lens a reduction element with a half-reflecting concave external surface and a fully reflecting concave internal surface with a central aperture upstream of the image field.

29. The method of claim 28 including achromatizing the reduction lens over the range of a source of actinic radiation for the scanning.

30. The method of claim 26 including overlapping successive scans by overlap widths that vary inversely with the length of the cords perpendicular to the scanning direction.

31. The method of claim 26 including using a monochromatic refractive reduction lens and a narrow bandwidth light source for the scans.

32. A reduction photolithographic system for imaging a reticle pattern of a microcircuit device onto a substrate with a reduction lens having a circular image field smaller than a region of the substrate exposed to the reticle pattern, the system comprising:

a. an illumination system for shaping the image field to an irregular hexagonal shape having sides disposed as cords of the image field;

b. a portion of the hexagonal shape between parallel sides oriented perpendicular to a scan direction forming a full exposure of a portion of the reticle pattern onto a corresponding portion of the substrate region with each scan;

c. overlapping half-exposure regions of the hexagonal shape being positioned for double exposing portions of the reticle pattern onto the substrate region in zones between successive scans; and d. dimensions of the irregular hexagonal shape being selected so that the full exposure portions and the double exposing portions combine for uniformly exposing the substrate region to the full reticle pattern in an integer number of substantially equal scans.

33. The system of claim 32 wherein the reduction lens is a catadioptric lens achromatized over a range of a deep UV source of actinic radiation.

34. The system of claim 33 wherein the lens has a reduction element with a concave, half-reflecting external surface and a concave, fully reflecting internal surface with a central aperture upstream of the image field.

35. The system of claim 32 wherein a width of the zones between successive scans varies inversely with a width of the full-exposure portion.

36. The system of claim 32 wherein the half-exposure regions are triangular.

37. The system of claim 32 wherein the reduction lens is a monochromatic refractive lens formed substantially of a single material, and the illuminating system uses a narrow bandwidth of illumination.

* * * * *